(12) United States Patent
Sakaguchi

(10) Patent No.: US 12,176,280 B2
(45) Date of Patent: Dec. 24, 2024

(54) INTERCONNECT SUBSTRATE AND METHOD OF MAKING INTERCONNECT SUBSTRATE

(71) Applicant: SHINKO ELECTRIC INDUSTRIES CO., LTD., Nagano (JP)

(72) Inventor: Yuta Sakaguchi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 282 days.

(21) Appl. No.: 17/663,288

(22) Filed: May 13, 2022

(65) Prior Publication Data

US 2022/0375842 A1  Nov. 24, 2022

(30) Foreign Application Priority Data

May 18, 2021 (JP) .................................. 2021-084134

(51) Int. Cl.
*H01L 23/498* (2006.01)
*H01L 21/48* (2006.01)

(52) U.S. Cl.
CPC .... *H01L 23/49833* (2013.01); *H01L 21/4857* (2013.01); *H01L 21/486* (2013.01); *H01L 23/49816* (2013.01); *H01L 23/49822* (2013.01); *H01L 23/49838* (2013.01)

(58) Field of Classification Search
CPC .. H05K 1/141; H05K 1/144; H05K 2201/045; H05K 1/0298
See application file for complete search history.

(56) References Cited

U.S. PATENT DOCUMENTS

| | | | |
|---|---|---|---|
| 2013/0149514 A1* | 6/2013 | Hayashi | H01L 23/145 428/323 |
| 2014/0118976 A1* | 5/2014 | Yoshikawa | H01L 23/5384 361/761 |
| 2020/0154568 A1* | 5/2020 | Na | H05K 3/0011 |
| 2022/0078907 A1* | 3/2022 | Kim | B32B 7/02 |
| 2022/0256704 A1* | 8/2022 | Ifis | H05K 1/0306 |

FOREIGN PATENT DOCUMENTS

| | | |
|---|---|---|
| JP | 2015-028963 | 2/2015 |
| JP | 2020-205331 | 12/2020 |

OTHER PUBLICATIONS

Office Action mailed on Oct. 1, 2024 issued with respect to the basic Japanese Patent Application No. 2021-084134.

* cited by examiner

*Primary Examiner* — Timothy J Thompson
*Assistant Examiner* — John B Freal
(74) *Attorney, Agent, or Firm* — IPUSA, PLLC

(57) ABSTRACT

An interconnect substrate includes an insulating resin layer having a first surface and a second surface opposite the first surface, a redistribution layer provided on the first surface of the insulating resin layer, a first connection terminal exposed at the second surface of the insulating resin layer, and a conductive via provided in the insulating resin layer to electrically connect the redistribution layer and the first connection terminal, wherein the insulating resin layer includes a first resin layer constituting the second surface and containing a first filler, a second resin layer provided on the first resin layer, and a third resin layer provided on the second resin layer, the third resin layer containing a second filler and constituting the first surface, and wherein an average particle diameter of the first filler is greater than an average particle diameter of the second filler.

14 Claims, 9 Drawing Sheets

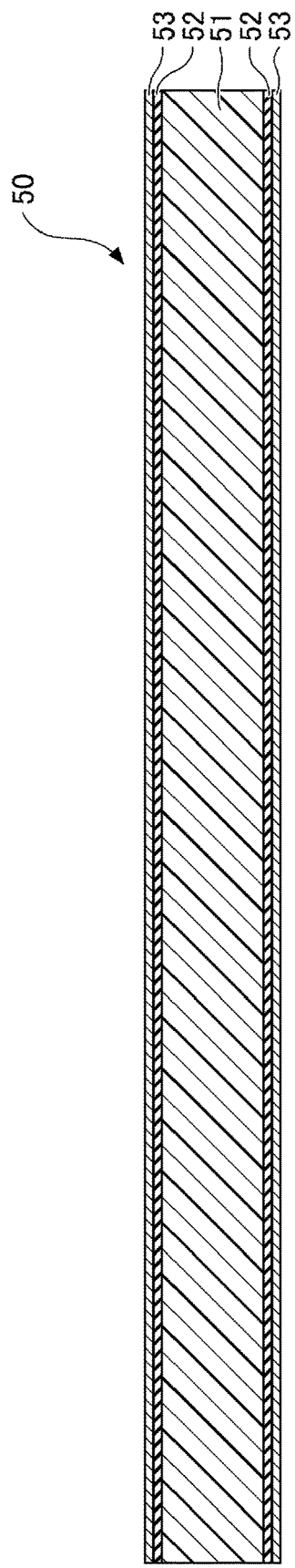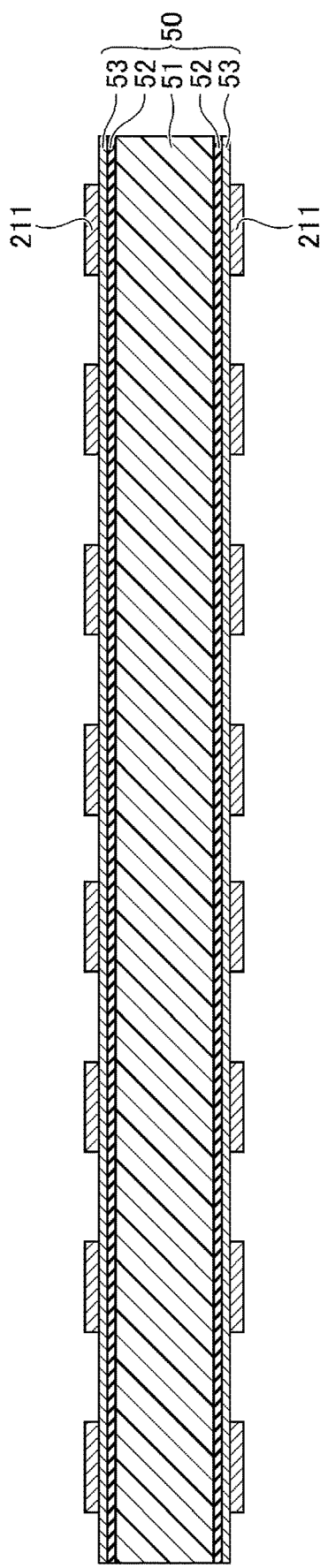

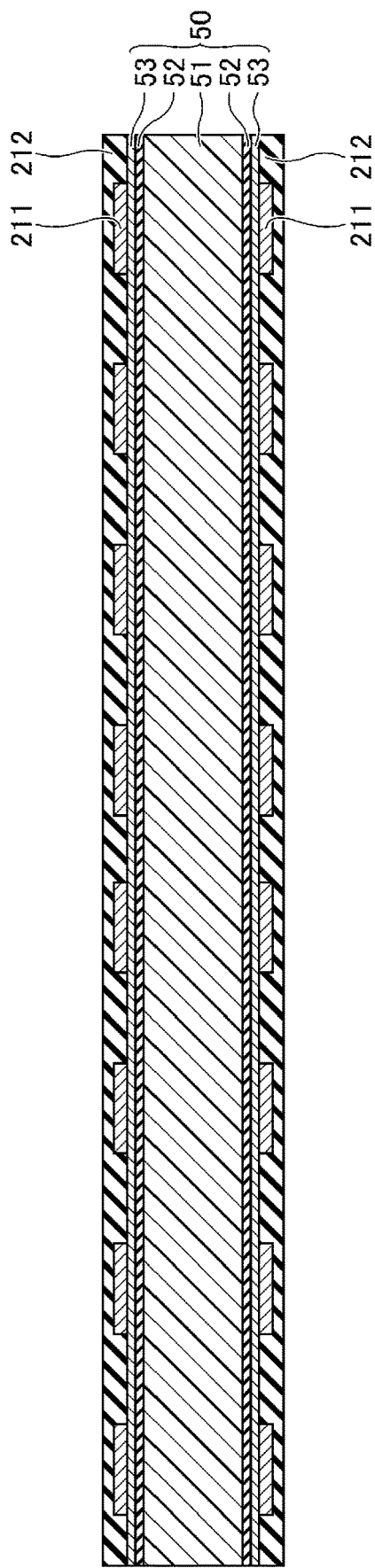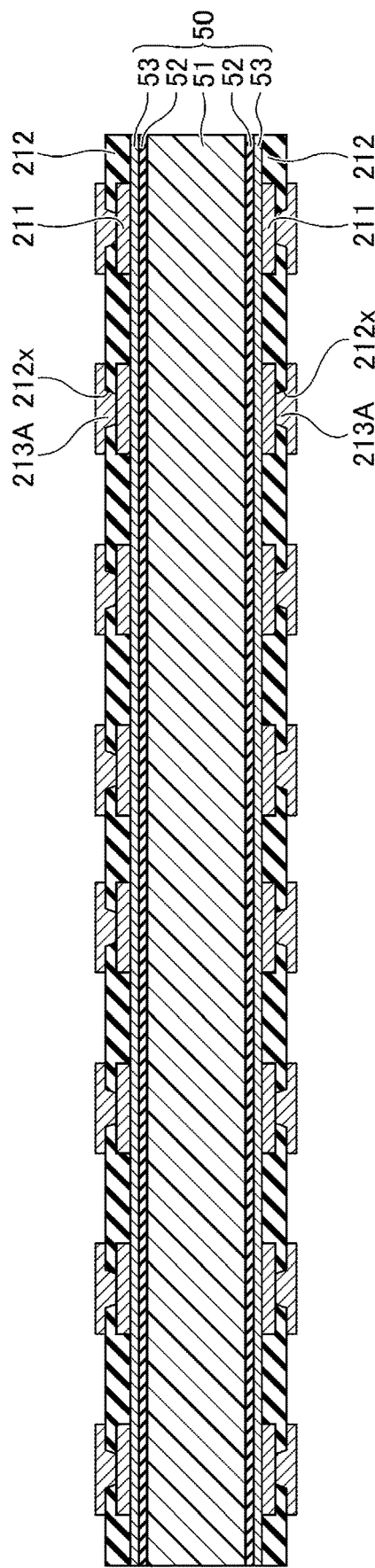

INTERCONNECT SUBSTRATE AND METHOD OF MAKING INTERCONNECT SUBSTRATE

CROSS-REFERENCE TO RELATED APPLICATIONS

The present application is based on and claims priority to Japanese Patent Application No. 2021-084134 filed on May 18, 2021, with the Japanese Patent Office, the entire contents of which are incorporated herein by reference.

FIELD

The disclosures herein relate to interconnect substrates and methods of making an interconnect substrate.

BACKGROUND

An interconnect substrate having an interposer mounted on a build-up substrate is known in the art (Patent Document 1).

The interconnect substrate disclosed in Patent Document 1 achieves an intended purpose, but may have a risk of having a bonding failure between the interposer and the build-up substrate.

There may be a need for an interconnect substrate and a method of making an interconnect substrate for which the probability of bonding failure is reduced.

[Patent Document 1] Japanese Laid-open Patent Publication No. 2020-205331

SUMMARY

According to an aspect of the embodiment, an interconnect substrate includes an insulating resin layer having a first surface and a second surface opposite the first surface, a redistribution layer provided on the first surface of the insulating resin layer, a first connection terminal exposed at the second surface of the insulating resin layer, and a conductive via provided in the insulating resin layer to electrically connect the redistribution layer and the first connection terminal, wherein the insulating resin layer includes a first resin layer constituting the second surface and containing a first filler, a second resin layer provided on the first resin layer on a same side as the first surface, and a third resin layer provided on the second resin layer on a same side as the first surface, the third resin layer containing a second filler and constituting the first surface, and wherein an average particle diameter of the first filler is greater than an average particle diameter of the second filler.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 3A and 3B are cross-sectional views illustrating a method of making the interconnect substrate according to the first embodiment;

FIGS. 4A and 4B are cross-sectional views illustrating the method of making the interconnect substrate according to the first embodiment;

DESCRIPTION OF EMBODIMENTS

In the following, the embodiment will be described with reference to the accompanying drawings. In the specification and drawings, elements having substantially the same functions or configurations are referred to by the same numerals, and a duplicate description thereof may be omitted.

First Embodiment

The first embodiment is directed to an interconnect substrate and a method of making the same.

[Structure of Interconnect Substrate]

Figure 1:
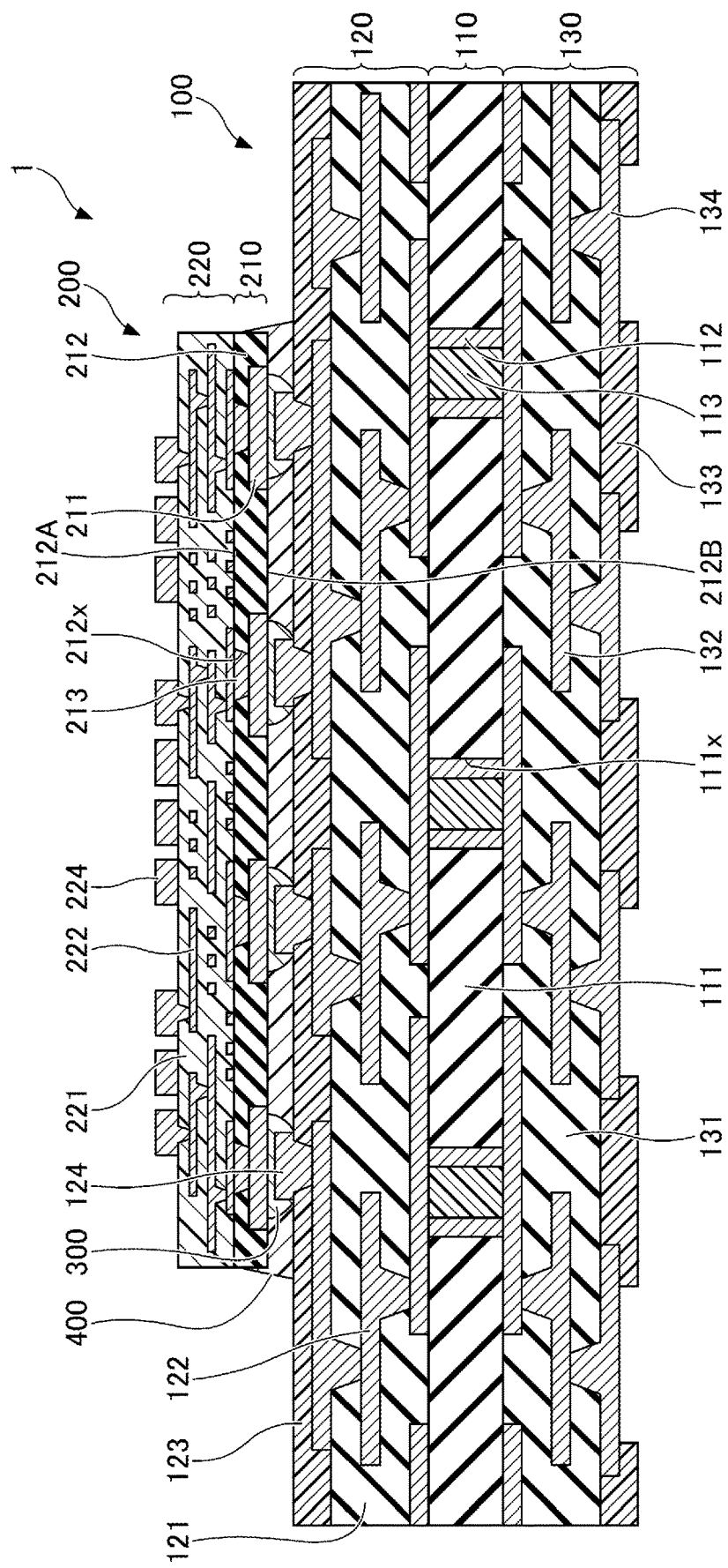
FIG. 1 is a cross-sectional view of an interconnect substrate according to a first embodiment.

In the following, the structure of an interconnect substrate of a first embodiment will be described. FIG. 1 is a cross-sectional view of an interconnect substrate according to a first embodiment.

An interconnect substrate 1 according to the first embodiment includes a build-up substrate 100, an interposer 200, a bonding material 300, and an adhesive layer 400. In the present disclosures, for the sake of convenience, the direction in which the interposer 200 is located as viewed from the build-up substrate 100 is denoted as the upward direction, and the opposite direction is denoted as the downward direction. The "plan view" refers to a view of an object taken in a direction normal to the upper surface of the build-up substrate 100. It may be noted, however, that the interconnect substrate may be used in an upside-down position, or may be placed at any angle.

The build-up substrate 100 includes, for example, a core layer 110, a build-up layer 120 provided on the upper surface of the core layer 110, and a build-up layer 130 provided on the lower surface of the core layer 110.

The core layer 110 includes an insulating substrate 111 with through-holes 111x formed therethrough, conductive through-vias 112 formed on the inner wall surface of the through-holes 111x, and a filler material 113 filling the inside of the conductive through-vias 112.

The build-up layer 120 includes insulating layers 121, interconnect layers 122, and a solder resist layer 123. The interconnect layers 122 include electrode pads 124 on the uppermost surface of the insulating layers 121. An example of the material of the interconnect layers 122 is a conductor such as copper. The electrode pads 124 are used as connection terminals when the build-up substrate 100 is bonded to the interposer 200. The electrode pads 124 are an example of a second connection terminal.

The build-up layer 130 includes insulating layers 131, interconnect layers 132, and a solder resist layer 133. The interconnect layers 132 include electrode pads 134 on the lowermost surface of the insulating layers 131. An example of the material of the interconnect layers 132 is a conductor such as copper. The electrode pads 134 are used as connection terminals when the build-up substrate 100 is bonded to an external component such as a motherboard.

The electrode pads 124 and the electrode pads 134 are electrically connected via the interconnect layers 122, the conductive through-vias 112, and the interconnect layers 132. The number of insulating layers 121 and interconnect layers 122 included in the build-up layer 120 and the number of insulating layers 131 and interconnect layers 132 included in the build-up layer 130 are not limited to particular numbers.

The interposer 200 includes a first interconnect structure 210 and a second interconnect structure 220 provided on the upper surface of the first interconnect structure 210, for example.

The first interconnect structure 210 includes electrode pads 211, an insulating resin layer 212, and conductive vias 213.

Figure 2:
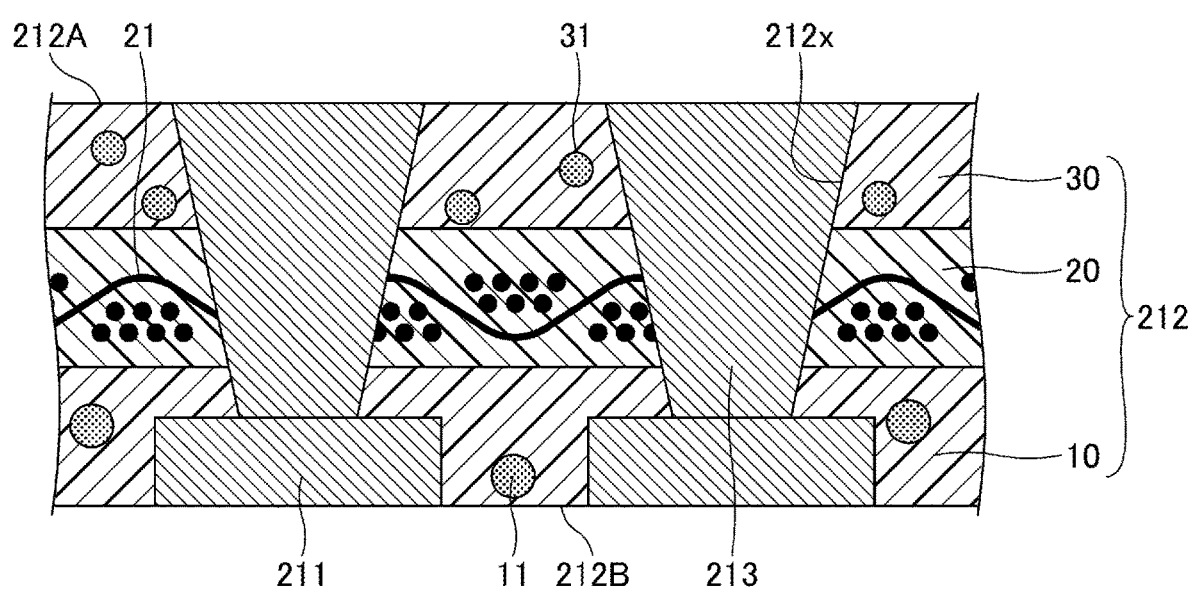
FIG. 2 is a cross-sectional view of an insulating resin layer.

In the following, the insulating resin layer 212 will be described. FIG. 2 is a cross-sectional view of the insulating resin layer 212.

The insulating resin layer 212 includes a first resin layer 10, a second resin layer 20 on the first resin layer 10, and a third resin layer 30 on the second resin layer 20. The third resin layer 30 may be thinner than the first resin layer 10 and the second resin layer 20. For example, the thickness of the first resin layer 10 and the thickness of the second resin layer 20 are about 20 μm, and the thickness of the third resin layer 30 is about 18 μm. The insulating resin layer 212 has an upper surface 212A and a lower surface 212B opposite the upper surface 212A. The third resin layer 30 constitutes the upper surface 212A, and the first resin layer 10 constitutes the lower surface 212B. The upper surface 212A is an example of a first surface and the lower surface 212B is an example of a second surface.

The second resin layer 20 is formed by impregnating glass fibers 21 with an insulating resin. The insulating resin used for impregnating the reinforcing member of the second resin layer 20 is cured, for example, by thermal curing. The first resin layer 10 and the third resin layer 30 contain a thermosetting resin, but do not contain glass fibers. The first resin layer 10 contains a first filler 11, and the third resin layer 30 contains a second filler 31. The first filler 11 and the second filler 31 are, for example, a silica filler or an alumina filler. The average particle diameter of the first filler 11 is greater than the average particle diameter of the second filler 31.

The electrode pads 211 are embedded in the first resin layer 10. The lower surface of the first resin layer 10 and the lower surface of the electrode pads 211 are flush with each other. The electrode pads 211 are exposed at the lower surface 212B of the insulating resin layer 212. The first resin layer 10 covers the side surfaces of the electrode pads 211.

The insulating resin layer 212 has via holes 212x formed therein that extend from the upper surface 212A to the upper surface of the electrode pads 211. The conductive vias 213 are provided in the via holes 212x. The conductive vias 213 are in contact with the electrode pads 211. The upper surface of the third resin layer 30 and the upper surface of the conductive vias 213 are flush with each other. An example of the material of the electrode pads 211 and the conductive vias 213 is a conductor such as copper. The electrode pads 211 are used as connection terminals when the interposer 200 is bonded to the build-up substrate 100. The electrode pads 211 are an example of a first connection terminal.

The second interconnect structure 220 includes insulating layers 221 and interconnect layers 222. Portions of the interconnect layers 222 are in contact with the conductive vias 213. The interconnect layers 222 include electrode pads 224 on the uppermost surface of the insulating layers 221. The material of the insulating layers 221 is an organic resin, for example. An example of the material of the interconnect layers 222 is a conductor such as copper. The electrode pads 224 are used as connection terminals when a semiconductor chip is mounted. The thickness of the second interconnect structure 220 is about 20 μm, for example. The numbers of insulating layers 221 and interconnect layers 222 included in the second interconnect structure 220 are not limited to particular numbers. The second interconnect structure 220 is an example of a redistribution layer.

The bonding material 300 joins the electrode pads 124 of the build-up substrate 100 and the electrode pads 211 of the interposer 200. The bonding material 300 is a tin (Sn) layer or a solder layer, for example. An Sn—Ag-based, Sn—Cu-based, or Sn—Ag—Cu-based lead-free solder, for example, may be used as the material of the solder layer.

The adhesive layer 400 is provided between the build-up substrate 100 and the interposer 200 to bond the build-up substrate 100 and the interposer 200 together. The adhesive layer 400 is based on epoxy, for example. The adhesive layer 400 may cover part of the side surfaces of the interposer 200.

[Method of Making Interconnect Substrate]

Figure 7:
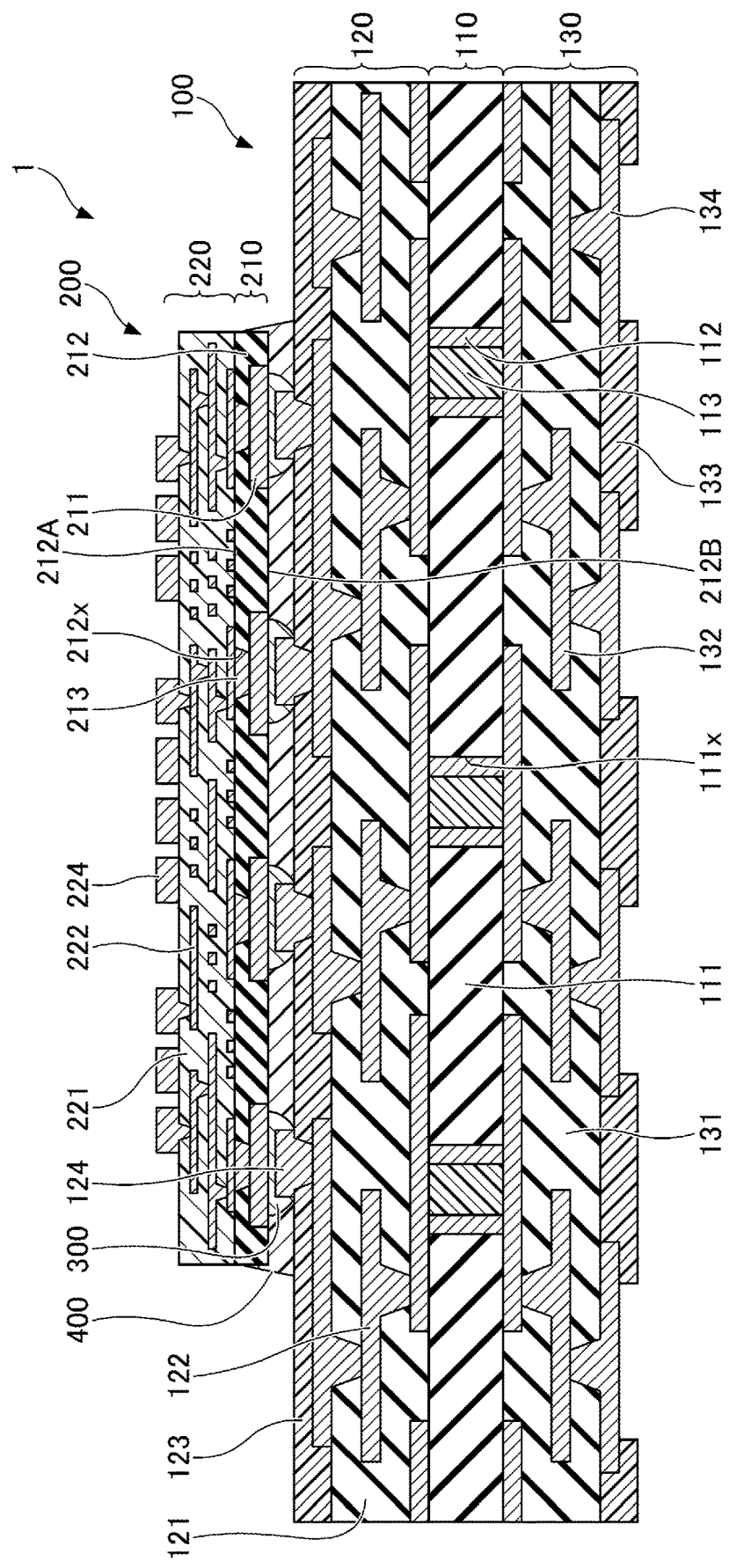
FIG. 7 is a cross-sectional view illustrating the method of making the interconnect substrate according to the first embodiment.

In the following, a method of making the interconnect substrate 1 of the first embodiment will be described. FIGS. 3A-3B through FIG. 7 are cross-sectional views illustrating the method of making the interconnect substrate 1 according to the first embodiment.

As illustrated in FIG. 3A, a support substrate 50 is provided. The support substrate 50 includes a support base 51, release layers 52, and copper foils 53. The release layers 52 and the copper foils 53 are formed on the upper and lower surfaces of the support base 51. One of the release layers 52 is situated between the support base 51 and one of the copper foils 53. The support base 51 may include a resin, and the release layers 52 may be inorganic-material layers, for example. The support substrate 50 is a large-size substrate from which a plurality of interposers 200 may be produced. Namely, the support substrate 50 includes a plurality of areas in each of which a structure corresponding to the interposer 200 is to be formed.

Subsequently, as illustrated in FIG. 3B, the electrode pads 211 are formed on the copper foils on the upper and lower sides of the support substrate 50. The electrode pads 211 may be formed by a semi-additive process, for example. Namely, a plating resist layer (not shown) having openings at positions at which the electrode pads 211 are to be formed is formed on the copper foil 53, followed by forming the electrode pads 211 made of copper or the like in the openings by an electroplating method that utilizes the copper foil 53 as a plating power feeding path. Thereafter, the plating resist layer is removed.

Subsequently, as illustrated in FIG. 4A, the insulating resin layers 212 are formed on the upper and lower sides of the support substrate 50 to cover the electrode pads 211 and the copper foil 53. In forming the insulating resin layer 212, the first resin layer 10 is formed first, and, then, the second resin layer 20 is formed on the first resin layer 10, followed by forming the third resin layer 30 on the second resin layer 20. The first resin layer 10 contains the first filler 11. The second resin layer 20 contains glass fibers 21. The third resin layer 30 contains the second filler 31. The thicknesses of the first resin layer 10, the second resin layer 20, and the third resin layer 30 are all about 20 µm, for example.

Subsequently, as illustrated in FIG. 4B, the via holes 212x that extend through the insulating resin layers 212 to the electrode pads 211 are formed on the upper and lower sides of the support substrate 50. The via holes 212x may be formed by laser machining, for example. After the formation of the via hole 212x, a desmear process is preferably performed to remove resin residues adhering to the surfaces of the electrode pads 211 exposed at the bottom of the via holes 212x.

The conductive layers 213A are then formed on the insulating resin layers 212 on the upper and lower sides of the support substrate 50, and are connected to the electrode pads 211 through the via holes 212x. The conductive layers 213A may be formed by a semi-additive process, for example. The method of forming the conductive layers 213A will be described in detail below. A seed layer (not shown) made of copper or the like is formed on each of the insulating resin layers 212 and inside the via holes 212x by electroless plating or sputtering. On the seed layer, a resist layer (not shown) for plating is formed that has openings at the positions at which the conductive layers 213A are to be formed. Electroplating that utilizes the seed layer as a plating-power feeding path is performed to form a metal plating layer made of copper or the like in the openings of the resist layer. Thereafter, the plating resist layer is removed. The seed layer is then removed by wet etching, which utilizes the metal plating layer as a mask. In this manner, the conductive layers 213A, each of which includes the seed layer and the metal plating layer, are formed.

Figure 5A:
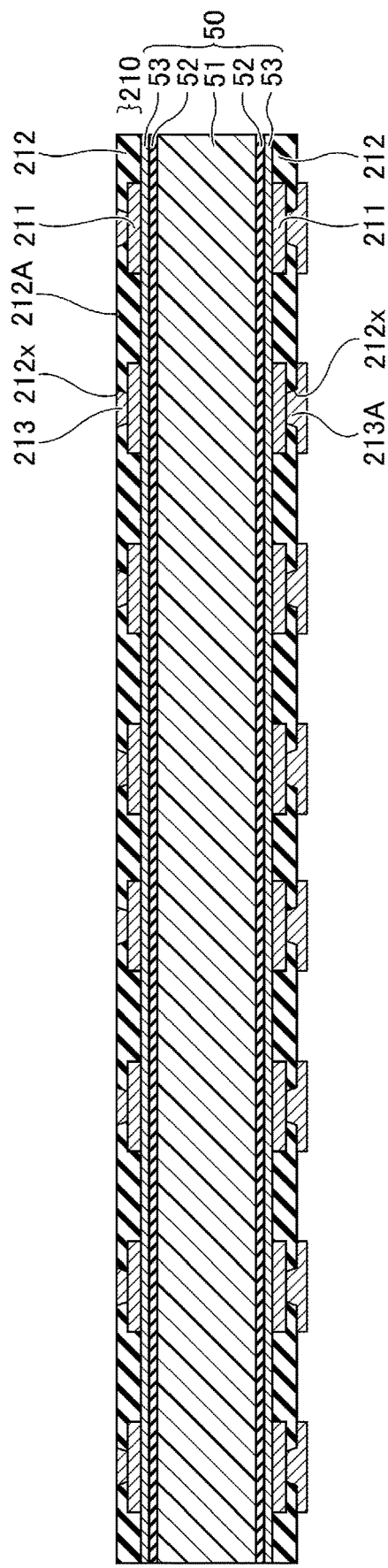
FIGS. 5A and 5B are cross-sectional views illustrating the method of making the interconnect substrate according to the first embodiment.

Subsequently, as illustrated in FIG. 5A, the conductive layer 213A and the surface of the insulating resin layer 212 on the upper side of the support substrate 50 are polished by a chemical mechanical polishing (CMP) method, which makes the upper surface of the conductive layer 213A and the upper surface 212A of the insulating resin layer 212 flush with each other. As a result of this polishing, the conductive vias 213 are formed in the via holes 212x. Further as a result of the polishing, the thickness of the third resin layer 30 becomes about 18 µm and thinner than the first resin layer 10 and the second resin layer 20.

In this manner, the first interconnect structure 210 is formed that includes the insulating resin layer 212, the conductive vias 213 in the insulating resin layer 212, and the electrode pads 211 connected to the conductive vias 213.

Figure 5B:
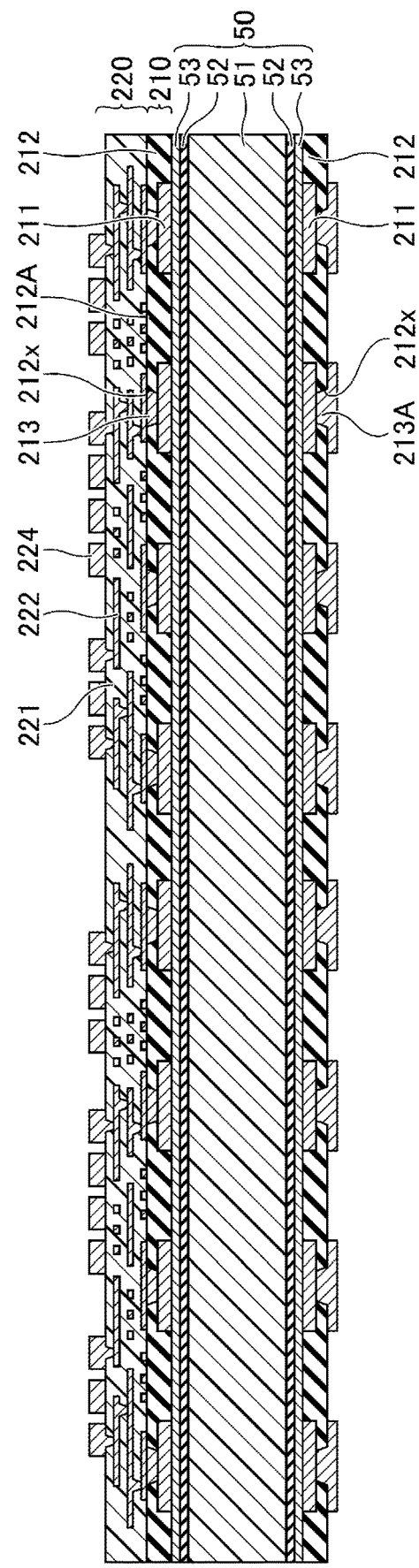

Thereafter, as illustrated in FIG. 5B, the second interconnect structure 220 including the insulating layers 221 and the interconnect layers 222 is formed on the insulating resin layer 212 and the conductive vias 213. The second interconnect structure 220 may be formed by a semi-additive process, for example. Portions of the interconnect layers 222 are in contact with the conductive vias 213. The interconnect layers 222 include the electrode pads 224 on the uppermost surface of the insulating layers 221.

Figure 6A:
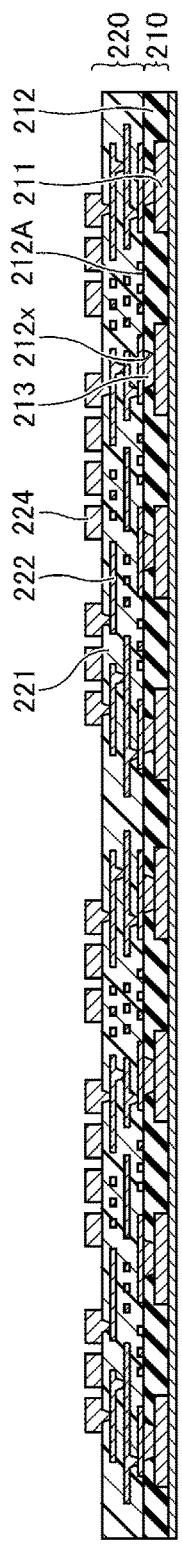
FIGS. 6A through 6C are cross-sectional views illustrating the method of making the interconnect substrate according to the first embodiment.

Subsequently, as illustrated in FIG. 6A, the first interconnect structure 210 and the second interconnect structure 220 are detached from the release layer 52 together with the copper foil 53.

Figure 6B:
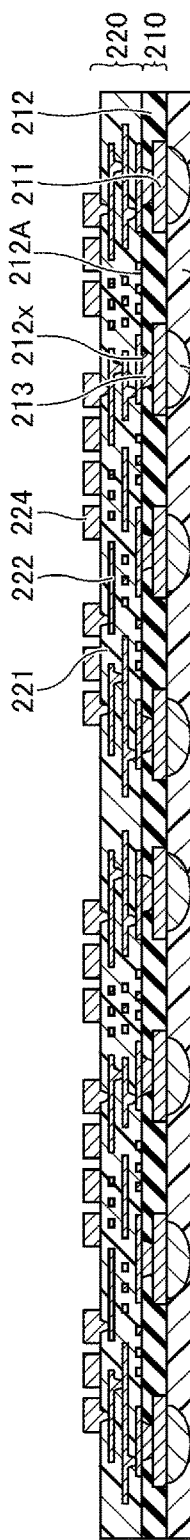

As illustrated in FIG. 6B, the copper foil 53 is then removed. The bonding material 300 is then provided on the lower surface of the electrode pads 211, and the adhesive layer 400 covering the bonding material 300 is formed on the lower surface 212B of the insulating resin layer 212. An epoxy-based NCF (non-conductive film) may be used as the adhesive layer 400.

Figure 6C:
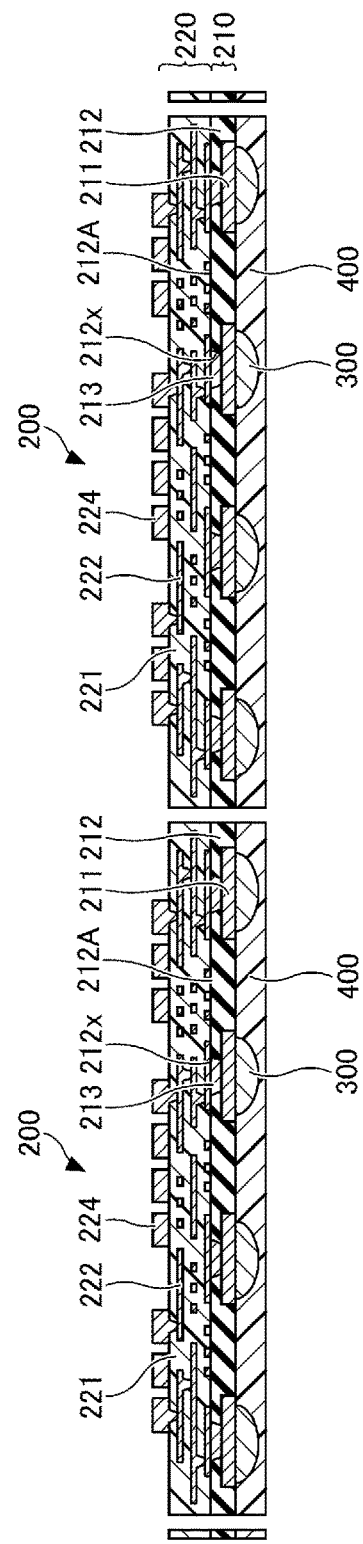

Subsequently, as illustrated in FIG. 6C, the structure which has the adhesive layer 400 attached thereto is cut along predetermined cut lines by a slicer or the like. As a result, structures each corresponding to the interposer 200 are obtained as separate pieces. Namely, a plurality of interposers 200 are obtained from the large-size support substrate 50.

As illustrated in FIG. 7, the build-up substrate 100 is separately prepared. The interposer 200 having the adhesive layer 400 is flip-chip-mounted to the build-up substrate 100 such that the electrode pads 211 face the electrode pads 124. In so doing, the electrode pads 211 and the electrode pads 124 are bonded to each other via the bonding material 300.

In this manner, the interconnect substrate 1 of the first embodiment is completed in final form.

In the first embodiment, the interposer 200 including the first interconnect structure 210 and the second interconnect structure 220 is constrained by the support substrate 50 until detached from the release layer 52. With this arrangement, even when there is a stress inside the interposer 200 to warp the interposer 200, the interposer 200 will not deform until detached from the release layer 52. In the presence of an internal stress to warp the interposer 200, however, the interposer 200 will be warped upon being detached from the release layer 52 because the interposer 200 is released from the constraints imposed by the support substrate 50. If the average particle diameter of the first filler 11 in the first resin layer 10 were similar to the average particle diameter of the second filler 31 in the third resin layer 30, for example, the interposer 200 would be likely to deform such as to bulge at the lower side (i.e., the side where the first interconnect structure 210 is provided). Such warpage, if happened, would result in uneven removal of the copper foil 53 or uneven distance between the electrode pads 211 of the interposer 200 and the electrode pads 124 of the build-up substrate 100, resulting in a bonding failure.

In the first embodiment, however, the average particle diameter of the first filler 11 is greater than the average particle diameter of the second filler 31. This arrangement serves to reduce stress inside the interposer 200. Accordingly, even after the interposer 200 is detached from the release layer 52, the interposer 200 is unlikely to be warped, which reduces the likelihood of bonding failure between the interposer 200 and the build-up substrate 100.

The average particle diameter of the first filler 11 is preferably from 0.05 µm to 1.00 µm, and more preferably from 0.10 µm to 0.80 µm. The average particle diameter of the second filler 31 is preferably 0.01 µm to 0.50 µm, and more preferably 0.05 µm to 0.30 µm.

The average particle diameter of the first filler 11 is preferably 3 to 100 times as large as the average particle diameter of the second filler 31, and more preferably 3 to 40 times as large.

The maximum particle diameter of the first filler 11 is preferably 0.05 µm to 5.00 µm, and more preferably 0.50 µm to 5.00 µm. The maximum particle diameter of the second filler 31 is preferably 0.10 µm to 1.00 µm, and more preferably 0.30 µm to 1.00 µm.

The particle diameters of the first filler and the second filler 31 can be measured by observing a cross-section of the insulating resin layer 212 perpendicular to the upper surface 212A by use of a scanning electron microscope (SEM). Cross-sectional observation may be made at a magnification factor of 30,000, for example.

In the cross-section of the insulating resin layer 212 perpendicular to the upper surface 212A, the proportion of the first filler 11 in the first resin layer 10 in terms of area may be lower than the proportion of the second filler 31 in the third resin layer 30 in terms of area. In the cross-section, the percentage of the first filler 11 in the first resin layer 10 in terms of area is preferably 40% to 70%, and more preferably 50% to 60%. In the cross-section, the percentage of the second filler 31 in the third resin layer 30 in terms of area is preferably 50% to 80%, and more preferably 60% to 70%.

In the cross-section of the insulating resin layer 212 perpendicular to the upper surface 212A, the number density of the first filler 11 in the first resin layer 10 may be lower than the number density of the second filler 31 in the third resin layer 30. In the cross-section, the number density of the first filler 11 in the first resin layer 10 is preferably particles/$\mu m^2$ to 10 particles/$\mu m^2$, and more preferably 5 particles/$\mu m^2$ to 6 particles/$\mu m^2$. In the cross-section, the number density of the second filler 31 in the third resin layer 30 is preferably particles/$\mu m^2$ to 40 particles/$\mu m^2$, and more preferably 26 particles/$\mu m^2$ to 29 particles/$\mu m^2$.

In the following, a simulation performed by the inventor of the present application will be described. In this simulation, the warpage of interposers after the respective support substrates were removed were calculated for the four types of condition (Condition No. 1, Condition No. 2, Condition No. 3, and Condition No. 4) in which the sizes of fillers contained in the first resin layer and the second resin layer varied. Table 1 shows the relationship between each condition and the fillers. In Table 1, the filler A is defined as having a maximum particle diameter of 1 $\mu$m and an average particle diameter of 0.1 $\mu$m, and the filler B is defined as having a maximum particle diameter of 5 $\mu$m and an average particle diameter of 0.5 $\mu$m. The warpage quantity is defined for an interposer whose plane shape is a square with each side being 300 mm long, and defined as displacements at the corners relative to the center thereof. The results of the simulations are shown in FIG. 8.

TABLE 1

| Condition No. | First Resin Layer | Third Resin Layer |
|---|---|---|
| 1 | A | A |
| 2 | B | A |
| 3 | B | B |
| 4 | A | B |

Figure 8:
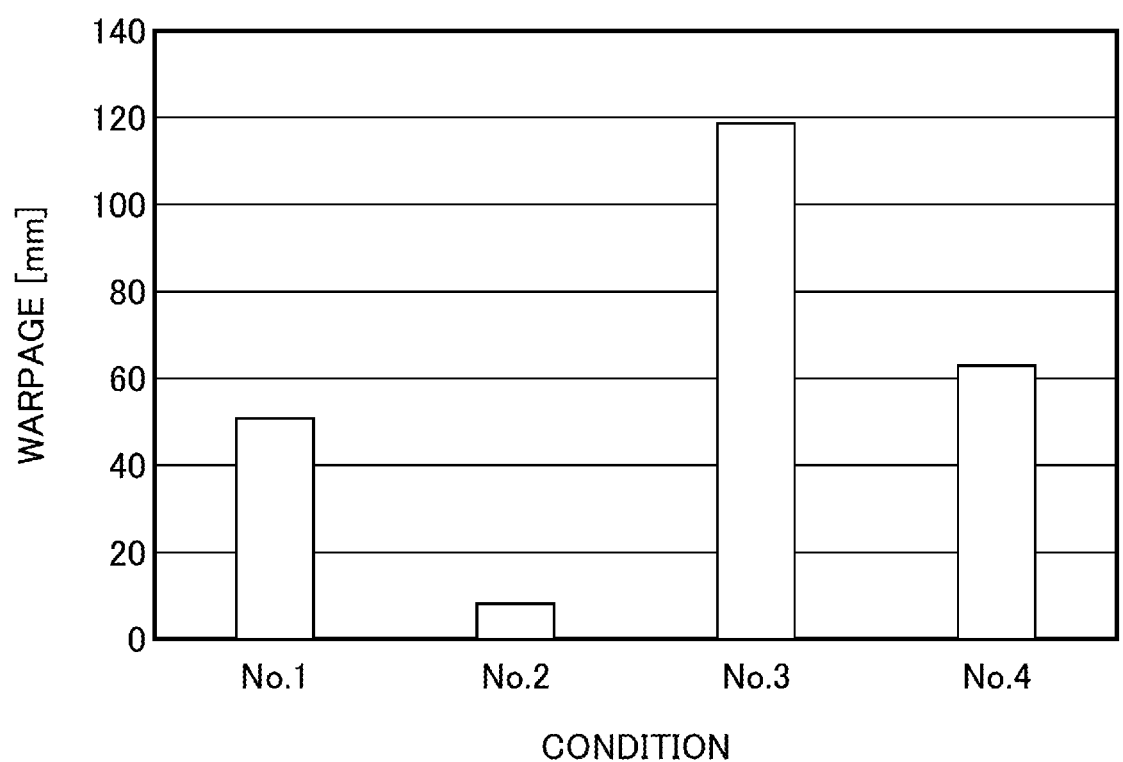
FIG. 8 is a drawing illustrating the results of simulation.

As shown in FIG. 8, the warpage quantity is significantly smaller in Condition No. 2 than in Condition No. 1, Condition No. 3, and Condition No. 4. Condition No. 2 is the one in which the average particle diameter of the filler in the first resin layer is greater than the average particle diameter of the filler in the third resin layer.

Second Embodiment

Figure 9:
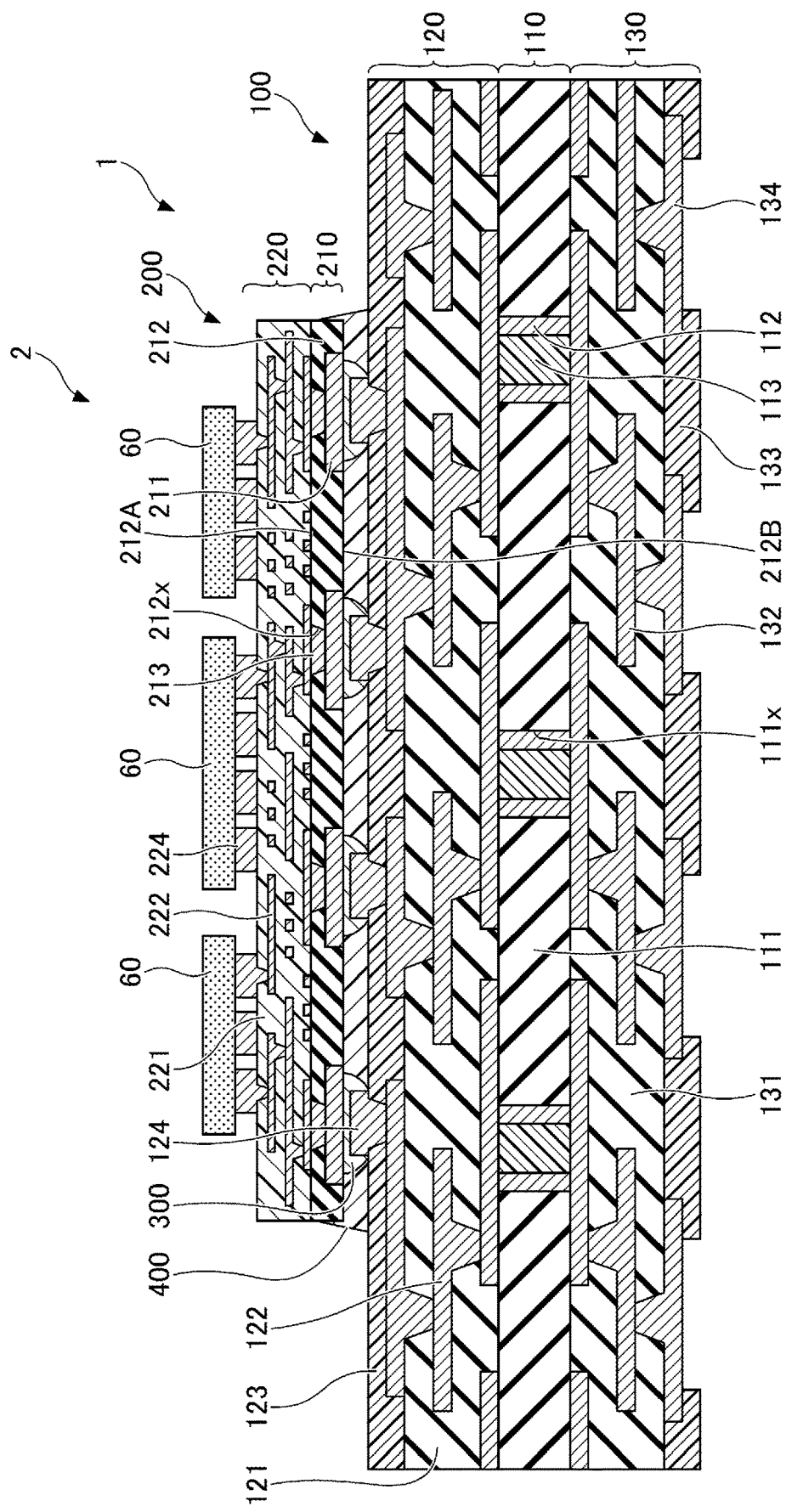
FIG. 9 is a cross-sectional view illustrating an example of a semiconductor apparatus according to a second embodiment.

In the following, a second embodiment will be described. The second embodiment is directed to a semiconductor apparatus. FIG. 9 is a cross-sectional view illustrating an example of a semiconductor apparatus according to the second embodiment.

In a semiconductor apparatus 2 according to the second embodiment, semiconductor chips 60 are mounted on the interposer 200 of the interconnect substrate 1 of the first embodiment. Namely, connection terminals (not shown) provided on the semiconductor chips 60 are connected to the electrode pads 224 via a bonding material (not shown) such as a solder.

Although a description has been given with respect to preferred embodiments and the like, the present invention is not limited to these embodiments and the like, but various variations and modifications may be made to these embodiments and the like without departing from the scope of the present invention.

According to at least one embodiment, the probability of bonding failure is reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

One aspect of the subject-matter described herein is set out non-exclusively in the following numbered clause.

[Clause 1] A method of making an interconnect substrate, comprising:
  forming a connection terminal on a support substrate;
  forming, on the support substrate, an insulating resin layer covering the connection terminal and having a first surface and a second surface opposite the first surface, the second surface facing the support substrate;
  forming, in the insulating resin layer, a conductive via connected to the connection terminal; and
  forming a redistribution layer on the first surface of the insulating resin layer,
  wherein the forming the insulating resin layer includes:
    forming a first resin layer constituting the second surface and containing a first filler;
    forming a second resin layer on the first resin layer on a same side as the first surface; and
    forming a third resin layer provided on the second resin layer on a same side as the first surface, the third resin layer containing a second filler and constituting the first surface, and
  wherein an average particle diameter of the first filler is greater than an average particle diameter of the second filler.

What is claimed is:
1. An interconnect substrate, comprising:
  an insulating resin layer having a first surface and a second surface opposite the first surface;
  a redistribution layer provided on the first surface of the insulating resin layer;
  a first connection terminal exposed at the second surface of the insulating resin layer; and
  a conductive via provided in the insulating resin layer to electrically connect the redistribution layer and the first connection terminal,
  wherein the insulating resin layer includes:
    a first resin layer constituting the second surface and containing a first filler;
    a second resin layer provided on the first resin layer on a same side as the first surface; and a third resin layer provided on the second resin layer on a same side as the first surface, the third resin layer containing a second filler and constituting the first surface, wherein an average particle diameter of the first filler is greater than an average particle diameter of the second filler, and wherein in a cross-section of the insulating resin layer perpendicular to the first surface, a percentage of the first filler in the first resin layer in terms of area is 40% to 70%, and a percentage of the second filler in the third resin layer in terms of area is 50% to 80%, the percentage of the first filler in the first resin layer in terms of area being lower than the percentage of the second filler in the third resin layer in terms of area.

2. The interconnect substrate as claimed in claim 1, wherein the average particle diameter of the first filler is 0.05 μm to 1.00 μm, and the average particle diameter of the second filler is 0.01 μm to 0.50 μm.

3. The interconnect substrate as claimed in claim 1, wherein the average particle diameter of the first filler is 3 to 100 times as great as the average particle diameter of the second filler.

4. The interconnect substrate as claimed in claim 1, wherein in a cross-section of the insulating resin layer perpendicular to the first surface, a number density of the first filler in the first resin layer is 2 particles/μm$^2$ to 10 particles/μm$^2$, and a number density of the second filler in the third resin layer is 20 particles/μm$^2$ to 40 particles/μm$^2$, the number density of the first filler in the first resin layer being lower than number density of the second filler in the third resin layer.

5. The interconnect substrate as claimed in claim 1, wherein the second resin layer contains glass fibers.

6. The interconnect substrate as claimed in claim 1, wherein the third resin layer is thinner than the first resin layer and the second resin layer.

7. The interconnect substrate as claimed in claim 1, further comprising a build-up substrate having a second connection terminal bonded to the first connection terminal.

8. An interconnect substrate, comprising:
an insulating resin layer having a first surface and a second surface opposite the first surface;
a redistribution layer provided on the first surface of the insulating resin layer;
a first connection terminal exposed at the second surface of the insulating resin layer; and
a conductive via provided in the insulating resin layer to electrically connect the redistribution layer and the first connection terminal, wherein the insulating resin layer includes:
a first resin layer constituting the second surface and containing a first filler;
a second resin layer provided on the first resin layer on a same side as the first surface; and
a third resin layer provided on the second resin layer on a same side as the first surface, the third resin layer containing a second filler and constituting the first surface, wherein an average particle diameter of the first filler is greater than an average particle diameter of the second filler, and wherein a thickness of the first resin layer is equal to a thickness of the second resin layer, and each of the first resin layer and the second resin layer is thicker than the third resin layer.

9. The interconnect substrate as claimed in claim 8, wherein the average particle diameter of the first filler is 0.05 μm to 1.00 μm, and the average particle diameter of the second filler is 0.01 μm to 0.50 μm.

10. The interconnect substrate as claimed in claim 8, wherein the average particle diameter of the first filler is 3 to 100 times as great as the average particle diameter of the second filler.

11. The interconnect substrate as claimed in claim 8, wherein in a cross-section of the insulating resin layer perpendicular to the first surface, a percentage of the first filler in the first resin layer in terms of area is 40% to 70%, and a percentage of the second filler in the third resin layer in terms of area is 50% to 80%.

12. The interconnect substrate as claimed in claim 8, wherein in a cross-section of the insulating resin layer perpendicular to the first surface, a number density of the first filler in the first resin layer is 2 particles/μm$^2$ to 10 particles/μm$^2$, and a number density of the second filler in the third resin layer is 20 particles/μm$^2$ to 40 particles/μm$^2$.

13. The interconnect substrate as claimed in claim 8, wherein the second resin layer contains glass fibers.

14. The interconnect substrate as claimed in claim 8, further comprising a build-up substrate having a second connection terminal bonded to the first connection terminal.

* * * * *